3,434,885

METHOD OF MAKING ELECTRICAL CONTACT ON SILICON SOLAR CELL AND RESULTANT PRODUCT

Joseph Mandelkorn and Jacob Broder, Cleveland Heights, Ohio, assignors to the United States of America as represented by the Administrator of the National Aeronautics and Space Administration No Drawing. Filed May 17, 1966, Ser. No. 551,846
Int. Cl. H01m 13/10
U.S. Cl. 136—89 7 Claims

ABSTRACT OF THE DISCLOSURE

An electrode connection for a n on p silicon solar cell is made by depositing a layer of cerium on the surface of the cell and then depositing a layer of silver on the cerium. The solar cell with the two layers deposited thereon is then sintered at a temperature between 500° C. and 800° C.

Statement of government ownership

The invention described herein was made by employees of the United States Government and may be manufactured and used by or for the Government for governmental purposes without the payment of any royalties thereon or therefor.

This invention is concerned with making an improved electrical contact to a surface of a semiconductor device. More particularly, the invention relates to the fabrication of an electrode connection for an improved n on p silicon solar cell.

Certain problems have been encountered with the electrical contacts on semiconductor devices. At least one surface of such a device is normally very smooth, and satisfactory contacts are difficult to achieve on such a surface.

It is important that the contact on a semiconductor surface be ohmic. That is, when an electrical potential is applied between any two surfaces to which contact is made and an electrical current is permitted to flow the voltage-current relationship should be linear and show no dependence upon the polarity of one surface with respect to the other. The contact-to-surface resistance should be as low as possible to minimize parasitic power losses. The contact should adhere strongly to the surface, and there should be no change in the electrical behavior of a contact during or after specified environmental device tests. The process for making the contact should neither degrade the characteristics of the device nor limit the surface contact to a small area.

In the past, semiconductor contacts were made by alloying a pellet or an evaporated deposit of a metal or a metal alloy into semiconductor surfaces. The semiconductor material would be heated to create the alloyed ohmic contact, and the depth to which alloying took place was controlled by varying the thickness of the evaporated deposit as well as the time and temperature of alloying. However, it was extremely difficult to make a satisfactory contact by this method to surfaces having p-n junctions less than one micron below the surface without shorting out the junction. This occurred when the alloy penetrated below the junction depth.

An additional problem encountered in making alloy contacts to the surfaces of silicon semiconductors was concerned with the attainment of a uniform contact. Silicon surfaces oxidize in air, and the surface oxide formed is not uniform. Therefore, the pellet or evaporated metal deposit does not lie on a silicon surface but on an oxide surface. When heat is applied to bring about the alloying, the pellet or deposited layer does not wet the silicon surface uniformly and a non-uniform surface contact results.

It has been suggested that an evaporated layer of silver could make an ohmic adherent contact to a smooth silicon surface if a layer of titanium was first evaporated onto the surface prior to the deposition of the silver. To assure strong adherence to the surface, the silicon is heated to a temperature below the alloying temperature of the silver-titanium-silicon. While the heating or sintering process does not produce any alloying, adherence of the contact is dependent upon the sintering temperature and the time at this temperature. The high temperatures of sintering required for good adherence of the silver-titanium contact degrades the junction characteristics of shallow junction devices.

Various modifications of conventional contacts have been proposed to produce satisfactory contacts on the smooth surfaces of semiconductor devices. However, each modification involved limitations and compromises between strength of adherence of the contact and degree of degradation of the junction characteristicse. The shallower the junction beneath the surface to which the contact is made, the more difficult it is to achieve a satisfactory contact.

These problems have been solved for silicon solar cells having extremely shallow p-n junctions by utilizing contacts prepared in accordance with the present invention. These contacts have a layer of a rare earth metal interposed between the surface of the semiconductor and a film of an electrically conducting metal.

It is, therefore, an object of the present invention to provide a method of fabricating a strongly adherent semiconductor contact which can be used on smooth surfaces having p-n junctions less than 0.5 micron below the surface without degrading the electrical characteristics and performance of the junctions.

Another object of the invention is to provide an improved semiconductor contact which utilizes a layer of cerium to react with an oxide layer on the semiconductor surface thereby insuring strong adhesion of the contact to the surface without changing the electrical characteristics of any junction below this surface.

Still another object of the invention is to provide an electrical contact for a semiconductor device in which rare earth metals or compounds are utilized to react on the semiconductor surfaces to obtain strong adhesion of non-alloyed contacts without degrading the characteristics of shallow p-n junctions below the surface.

These and other objects of the invention will be apparent from the specification which follows.

According to the present invention, a continuous layer of a rare earth metal is deposited onto the portion of the smooth surface of a semiconductor device where the electrode connection is to be made. This layer is deposited by thermal evaporation techniques which are well known in the art. A continuous layer of an electrically conducting metal is then evaporated onto the rare earth metal layer in a similar manner.

The semiconductor device with the two metal layers deposited thereon is then heated to an elevated temerature below that at which alloying occurs in an inert or a reducing atmosphere. This temperature is maintained for a period of about five minutes to sinter the metal layers. Various times and temperatures can be used. For example, temperatures in the 500–800° C. range for times of 5–60 minutes will produce satisfactory contacts.

In order to demonstrate the advantages of electrode connections fabricated in accordance with the present invention, silver-cerium contacts were made on n on p silicon solar cells having extremely shallow junctions. Silver-titanium contacts were also made on similar solar cells, and the electrical characteristics obtained with both types of contacts are compared in Table I.

TABLE I.—CONTACT CHARACTERISTICS

| Characteristic | Silver-Titanium | Silver Cerium |
|---|---|---|
| Slope, $R_c$, ohms | 0.25 | 0.2 |
| "n" value | >2 | 1.2–1.4 |
| Diode reverse current, $I_R$, ${}_yA$ | >100 | <20 |
| Open-circuit voltage, $V_{oc}$, V | <0.52 | 0.54 |
| Break load, g | 500 | 1,500 |

The first line of Table I sets forth the slope, $R_c$, of the forward biased diode voltage-current curve in the 300 to 400 ma. region. The third line lists the diode reverse current, $I_r$, for 0.6 —v. bias.

Both tyes of contacts were made by identical processes using a 600° C. sintering temperature for a period of five minutes. The shallow diffused solar cells had a 0.2 micron junction depth. As shown in Table I, the junction characteristics of these cells are badly degraded when silver-titanium contacts were applied, whereas the silver-cerium contacted cells have excellent characteristics. It was found that the silver-cerium contact made did not introduce any junction degradation at a sintering temperature of 800° C.

The cerium layer had a thickness of approximately 50 Angstrom units. The silver layer had a thickness of 20,000 Angstrom units.

It is evident from Table I that rare earth metals, such as cerium, are superior to titanium for making electrode contacts to shallow junction devices. This advantage is achieved because the rare earth metals actively attack the oxides on semiconductor surfaces and they contain less detrimental impurities than titanium.

In order to illustrate the superior adherence of contacts made in accordance with the invention, commercial solar cells having platted contacts, silver-titanium contacts and silver-cerium contacts were temperature cycled from liquid nitrogen temperatures to 100° C. for 15 seconds. This was accomplished by dipping the cells in liquid nitrogen until they reached temperature equilibrium. The cells were then removed rapidly and plunged into boiling water.

After fifty temperature cycles, some of the plated contacts peeled from the surface of the solar cells. The silver-titanium and silver-cerium contacts were unchanged in electrical characteristics after this many temperature cycles. Wire leads were attached to the solar cells which passed the temperature cycling test and weights were suspended from the leads. The plated cell contacts pulled away from the solar cells when weights of 300 grams were attached to them. The silver-titanium contacts pulled away for weights of 500 grams while the silver-cerium contact was not pulled away by a weight of 1500 grams. These values are shown on the last line in Table I.

While a preferred embodiment of the invention has been shown and described, it will be appreciated that various modifications may be made without departing from the spirit of the invention or the scope of the subjoined claims. For example, silver was chosen as the top evaporated layer in order to obtain high electrical conductivity of the evaporated contact sheet. It is contemplated that other metals could be used provided the sheet resistance and thickness of the evaporated layer were not critical.

What is claimed is:

1. An electrical contact for a surface of a silicon solar cell having a silicon oxide layer thereon comprising a layer of cerium on the surface reacted with the silicon oxide layer, and a layer of silver on said cerium.

2. An electrical contact as claimed in claim 1 wherein the layers are non-alloyed with the solar cell surface thereby maintaining the integrity and properties of the original solar cell surface.

3. An electrical contact as claimed in claim 1 wherein the surface is on a silicon solar cell having p-n junctions less than 0.5 micron below said surface.

4. An electrical contact as claimed in claim 1 wherein the cerium layer has a thickness of about 50 Angstrom units.

5. An electrical contact as claimed in claim 1 wherein the silver layer has a thickness of about 20,000 Angstrom units.

6. A method for forming a strongly adhesive electrical contact on the surface of a silicon solar cell having an oxide layer thereon and p-n junctions less than 0.5 micron below said surface without degrading the electrical characteristics and performance of said junctions comprising the steps of depositing a layer of cerium on the silicon solar cell surface to react with the oxide layer, depositing a layer of silver on said cerium, and sintering the silicon solar cell with said layers deposited thereon at a temperature less than about 800° C. so that said layers do not alloy with the silicon solar cell.

7. A method of forming an electrical contact as claimed in claim 6 including the step of sintering the silicon solar cell and layers at a temperature in the range of 600° to 700° C. for about five minutes.

References Cited

UNITED STATES PATENTS

| | | | |
|---|---|---|---|
| 2,537,257 | 1/1951 | Brattain | 136—89.05 |
| 3,274,024 | 9/1966 | Hill et al. | 117—200 |

ALLEN B. CURTIS, *Primary Examiner.*

U.S. Cl. X.R.

117—200